United States Patent
Chan et al.

(10) Patent No.: US 10,475,666 B2
(45) Date of Patent: Nov. 12, 2019

(54) ROUTABLE ELECTROFORMING SUBSTRATE COMPRISING REMOVABLE CARRIER

(71) Applicant: ASM Technology Singapore Pte Ltd, Singapore (SG)

(72) Inventors: Tat Chi Chan, Hong Kong (HK); Yiu Fai Kwan, Hong Kong (HK); Gio Jose Asumo Villaespin, Singapore (SG); Yu Lung Lam, Hong Kong (HK); Hang Ren, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/951,215

(22) Filed: Apr. 12, 2018

(65) Prior Publication Data

US 2018/0308710 A1    Oct. 25, 2018

Related U.S. Application Data

(60) Provisional application No. 62/488,267, filed on Apr. 21, 2017.

(51) Int. Cl.
*H01L 21/48* (2006.01)
*H01L 21/56* (2006.01)
*H01L 23/498* (2006.01)
*H01L 23/00* (2006.01)
*H01L 23/31* (2006.01)

(52) U.S. Cl.
CPC .......... *H01L 21/4857* (2013.01); *H01L 21/56* (2013.01); *H01L 23/3121* (2013.01); *H01L 23/49822* (2013.01); *H01L 24/49* (2013.01); *H01L 24/85* (2013.01)

(58) Field of Classification Search
CPC ............... H01L 21/4857; H01L 21/568; H01L 23/3121; H01L 24/85; H01L 24/49; H01L 23/49822; H01L 21/56; H01L 2224/2919; H01L 2221/68345; H01L 2224/32225; H01L 2224/48229; H01L 2224/73265; H01L 2224/83192; H01L 2224/83855
See application file for complete search history.

(56) References Cited

U.S. PATENT DOCUMENTS

| | | | |
|---|---|---|---|
| 7,795,071 B2 | 9/2010 | Hwee-seng et al. | 438/106 |
| 2008/0145967 A1 | 6/2008 | Chew et al. | 438/106 |
| 2010/0289054 A1* | 11/2010 | Lin | H01L 21/486 257/99 |
| 2016/0013139 A1* | 1/2016 | Lim | H01L 23/49838 257/669 |

FOREIGN PATENT DOCUMENTS

TW    201214645 A1    4/2012
WO    WO 2013/097046 A1    7/2013

* cited by examiner

*Primary Examiner* — Yasser A Abdelaziez
(74) *Attorney, Agent, or Firm* — Ostrolenk Faber LLP

(57) ABSTRACT

A routable electroforming substrate for assembling a semiconductor package is manufactured by providing a carrier and plating a patterned first metallic layer onto the carrier which is configured to function as a surface mount pad or input/output pad in an assembled semiconductor package. A patterned second metallic layer comprising copper is plated over the first metallic layer, and a third metallic layer, which is configured for mounting a plurality of semiconductor dice, is plated over the second metallic layer. The carrier is then removed to expose the first metallic layer.

15 Claims, 6 Drawing Sheets

ROUTABLE ELECTROFORMING SUBSTRATE COMPRISING REMOVABLE CARRIER

FIELD OF THE INVENTION

The invention relates to substrates used in the assembly and packaging of electronic devices.

BACKGROUND AND PRIOR ART

Conventionally, semiconductor packages have been manufactured from assembling semiconductor dice on substrates in the form of lead frames. Such substrates support the semiconductor dice during die bonding, wire bonding and encapsulation of the dice and wire bonds. After encapsulation, the substrates and encapsulant are cut or singulated to form separate semiconductor packages.

Driven by portable devices, wearable devices and other consumer products, there is an increasing demand in the semiconductor packaging industry to produce devices with smaller form factors. To do so, thinner substrates which are more compact and have routable circuits are required to attain the objects of such cost-effective advanced packaging solutions.

For instance, U.S. Pat. No. 7,795,071 entitled "Semiconductor Package for Fine Pitch Miniaturization and Manufacturing Method thereof" discloses a fine pitch semiconductor manufacturing package substrate and a process using the substrate. Conductive electrical traces are embedded in and isolated by an insulating layer on a carrier, after which the carrier is selectively etched to create a finished product.

A problem with the said approach is that, for very thin package substrates, such as those which are 100 μm or thinner, many challenges such as warpage or cracks in the substrate are encountered during the manufacturing of the substrate, as well as during its handling in the semiconductor assembly process. These lead to lower yield and higher costs, and impose limitations on the ability to make the semiconductor packages even thinner.

SUMMARY OF THE INVENTION

It is thus an object of the invention to seek to provide a substrate used for semiconductor assembly and package that is suitable for assembling thin packages and are inherently more robust during handling in the semiconductor assembling process.

According to the first aspect of the invention, there is provided a method of manufacturing a routable electroforming substrate for assembling a semiconductor package, comprising the steps of: providing a carrier; plating a patterned first metallic layer onto the carrier which is configured to function as a surface mount pad or input/output pad in an assembled semiconductor package; plating a patterned second metallic layer comprising copper over the first metallic layer; plating a third metallic layer over the second metallic layer which is configured for mounting a plurality of semiconductor dice onto the third metallic layer; and thereafter removing the carrier to expose the first metallic layer.

According to the second aspect of the invention, there is provided a routable electroforming substrate for assembling a semiconductor package, the substrate comprising: a carrier; a first metallic layer which is configured to function as a surface mount pad or input/output pad in an assembled semiconductor package; a second metallic layer comprising copper over the first metallic layer; and a third metallic layer over the second metallic layer which is configured for mounting a plurality of semiconductor dice onto the third metallic layer; wherein the carrier is removable to expose the first metallic layer.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An example of a substrate and a manufacturing process thereof in accordance with the invention will now be described with reference to the accompanying drawings, in which.

DETAILED DESCRIPTION OF THE PREFERRED EMBODIMENT OF THE INVENTION

Figure 1A:
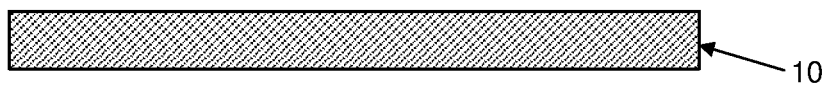
FIGS. 1A to 1P illustrate a process for fabricating a substrate according to the preferred embodiment of the invention.
Figure 1B:
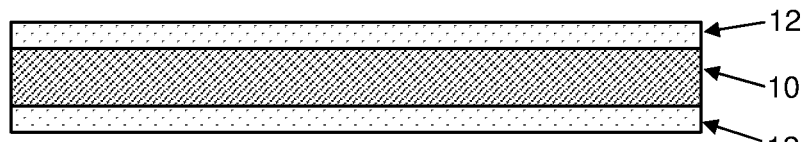
Figure 1C:
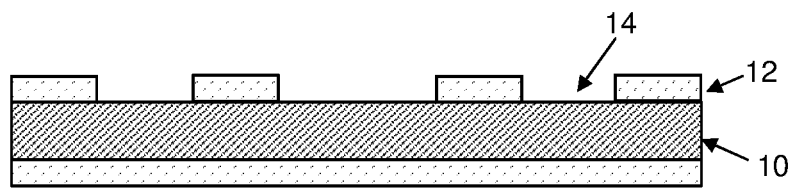
Figure 1D:
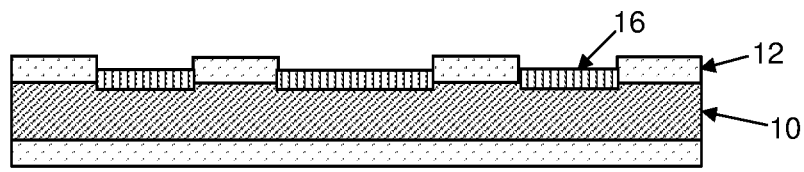
Figure 1E:
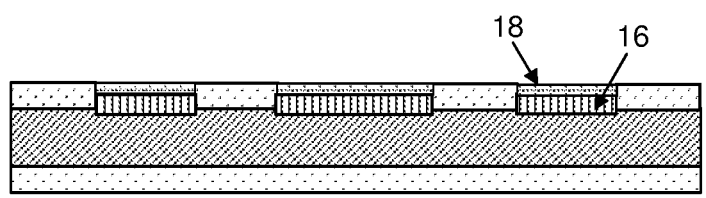
Figure 1F:
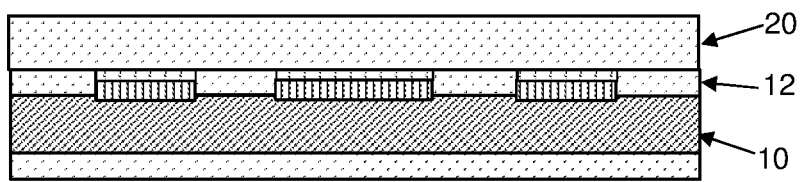
Figure 1G:
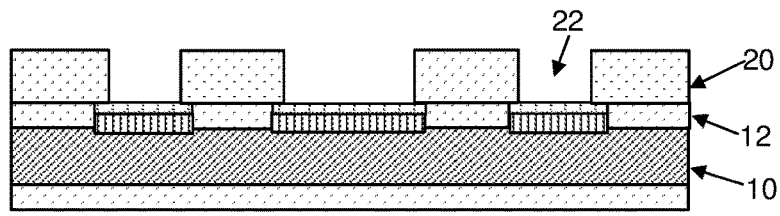
Figure 1H:
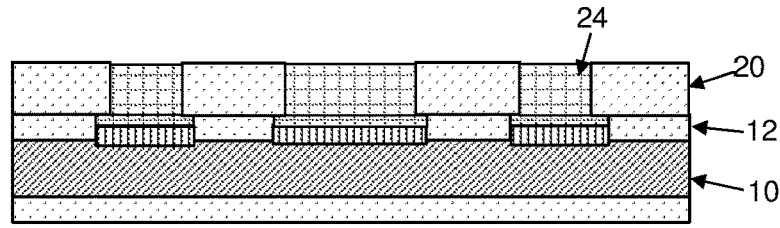
Figure 1I:
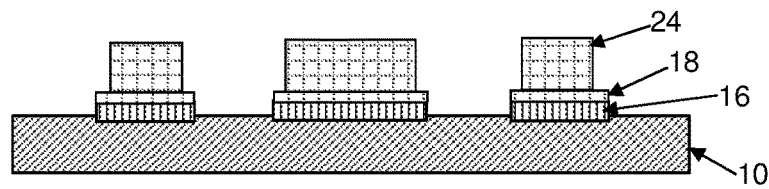
Figure 1J:
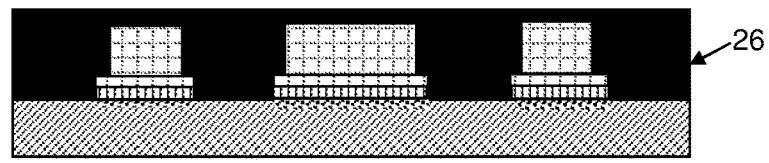
Figure 1K:
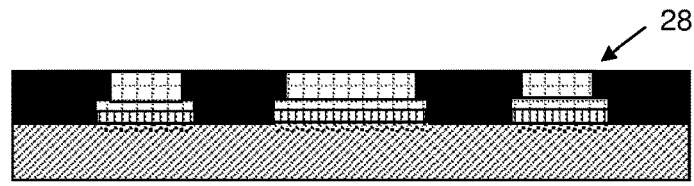
Figure 1L:
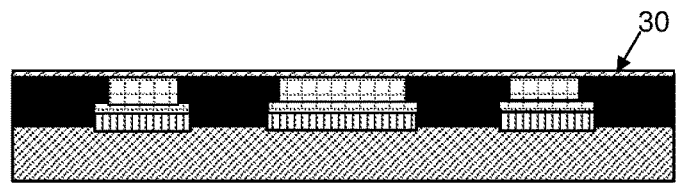
Figure 1M:
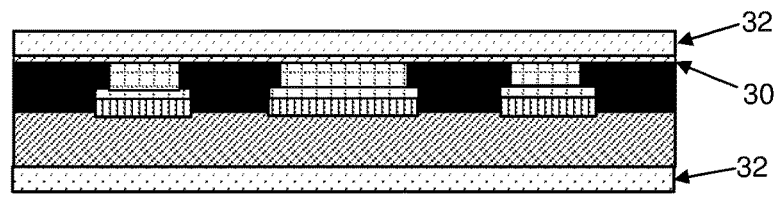
Figure 1N:
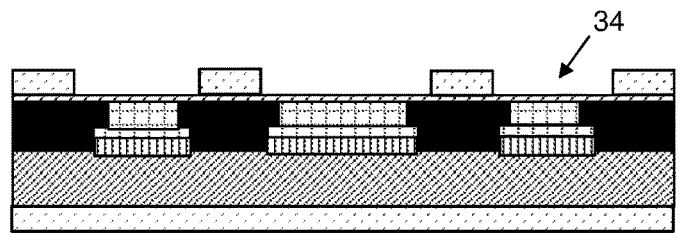
Figure 1O:
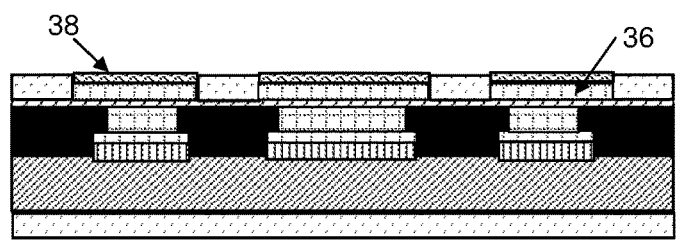
Figure 1P:
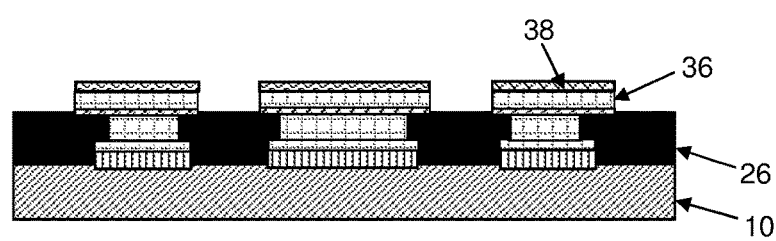

FIGS. 1A to 1P illustrate a process for fabricating a routable electroforming substrate for assembling a semiconductor package according to the preferred embodiment of the invention. In FIG. 1A, a substrate carrier 10 is provided. The substrate carrier 10 is made of an electrically conductive material and is preferably attractable by magnetic forces. In one embodiment, the substrate carrier 10 comprises stainless steel, in particular stainless steel grade 430. The surfaces of the substrate carrier 10 should first be chemically treated to remove all stains, oil marks and contamination prior to usage to ensure that they are clean.

In FIG. 1B, first photo-resist layers 12 are formed onto the surfaces of the substrate carrier 10, by laminating and covering top and bottom surfaces of the substrate carrier 10 with photosensitive dry film. In FIG. 1C, the first photo-resist layer 12 is patterned by selective exposure of the first photo-resist layer 12 to ultraviolet light, or by direct laser image processing to create a pre-defined pattern on the first photo-resist layer 12. Whether selective exposure to ultraviolet light or laser image processing is used, portions of the first photo-resist layer 12 are thereafter chemically removed so as to create exposed portions 14 in the first photo-resist layer 12. The exposed portions 14 serve to expose the surface of the substrate carrier 10 beneath the first photo-resist layer 12. Optionally, a chemical roughening process can then be applied to roughen the exposed underlying surface of the substrate carrier 10 by removing a portion of its exposed surface.

In FIG. 1D, a first metallic layer 16 is formed to a predetermined thickness inside the exposed portions 14 of the first photo-resist layer 12 by an electroplating process which uses the patterned first photo-resist layer 12 as a mask. The first metallic layer 16 will comprise a surface mount pad or an input/output pad in a finished semiconductor package. Thus, the first metallic layer 16 preferably comprises a gold layer, gold-nickel layers, or gold-palladium-nickel layers. Thereafter, in FIG. 1E, a remainder of the exposed portions 14 that have been plated with gold and/or nickel may be filled with another metal, such as copper, to form an intermediate metallic layer 18 which is flush with the first photo-resist layer 12.

In FIG. 1F, a second photo-resist layer 20 is formed over the first photo-resist layer 12 and the first and intermediate metallic layers 16, 18 by laminating and covering them with a photosensitive dry film. The second photo-resist layer 20 is further patterned as shown in FIG. 1G by selective exposure of the second photo-resist layer 20 to ultraviolet light and chemically removing portions of the second photo-resist layer 20, or by direct laser image processing followed by chemically removing portions of the second photo-resist layer 20, in order to create a pre-defined pattern on the second photo-resist layer 20. This process creates exposed portions 22 in the second photo-resist layer 20. The exposed portions 22 in the second photo-resist layer 20 expose corresponding top surfaces of portions of the intermediate metallic layer 18.

In FIG. 1H, a second metallic layer 24 is formed in the exposed portions 22 of the second photo-resist layer 20 by an electroplating process which uses the patterned second photo-resist layer 20 as a mask. The second metallic layer 24 may serve as via interconnects to the first and intermediate metallic layers 16, 18, such that it defines vertical posts that are formed on top of and are smaller in surface area than the first and intermediate metallic layers 16, 18. The second metallic layer 24 may in fact consist of a single or multiple metallic layers, and preferably comprises copper.

In FIG. 1I, the first and second photo-resist layers 12, 20 have been removed by either of the processes described above to reveal the first, intermediate and second metallic layers 16, 18, 24, after which the plurality of metallic layers may be molded. As illustrated in FIG. 1J, a first dielectric layer 26 is formed to encapsulate the plurality of metallic layers 16, 18, 24. The first dielectric layer 26 comprises molding compound that is introduced by a molding process, such as transfer molding, injection molding or compression molding, or by a film lamination process. The molding compound may comprise epoxy resin and silica fillers. The plurality of metallic layers 16, 18, 24 have been over-molded such that an excess layer of molding compound 26 is formed that covers, in particular, the second metallic layer 24.

In FIG. 1K, an excess portion of the first dielectric layer 26 has been removed to planarize and to expose a top surface of the second metallic layer 24. Such removal may be conducted by a mechanical planarization process such as grinding or buffing, or by using a chemical planarization process. After planarization, a conductive seed layer 30 is formed onto the surface of the first dielectric layer 26 and the second metallic layer 24, as shown in FIG. 1L. The conductive seed layer 30 preferably comprises copper, and may be formed by electroless plating, or by a sputtering process.

In FIG. 1M, a third photo-resist layer 32 is formed onto the conductive seed layer 30 as well as the bottom surface of the substrate carrier 10, by laminating and covering the same with photosensitive dry films. The third photo-resist layer 32 is further patterned as shown in FIG. 1N by selective exposure of the third photo-resist layer 32 to ultraviolet light and chemically removing portions of the third photo-resist layer 32, or by direct laser image processing followed by chemically removing portions of the third photo-resist layer 32, in order to create a pre-defined pattern on the third photo-resist layer 32. This process creates exposed portions 34 in the third photo-resist layer 32. The exposed portions 34 in the third photo-resist layer 32 expose corresponding top surfaces of portions of the underlying conductive seed layer 30.

FIG. 1O shows a third metallic layer 36 and a finishing metallic layer 38 which are consecutively filled into the exposed portions of the third photo-resist layer 32 by electroplating using the patterned third photo-resist layer 32 as a mask. The third metallic layer 36 may comprise a trace layer formed from a single metal such as copper, and the finishing metallic layer 38 may be a surface finishing that comprises nickel-gold layers, nickel-palladium-gold layers or a silver layer. In FIG. 1P, the third photo-resist layer 32 has been removed. The conductive seed layer 30 has also been removed, preferably by a chemical etching process, to expose the underlying first dielectric layer 26 at portions of the conductive seed layer 30 that have not been plated with any metallic layers.

Figure 2A:
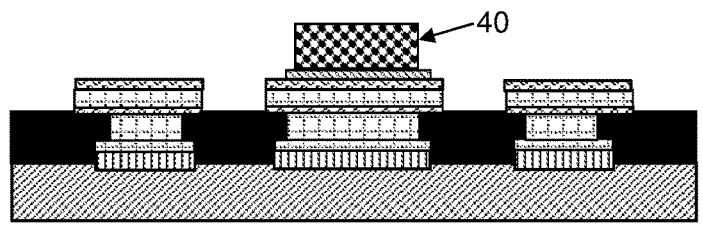
FIGS. 2A to 2D illustrate a method for assembling a semiconductor die before removing a substrate carrier for supporting the semiconductor die.

FIGS. 2A to 2D illustrate a method for assembling a semiconductor die 40 before removing the substrate carrier 10 for supporting the semiconductor die 40. The semiconductor die 40 is first bonded onto the uppermost finishing metallic layer 38, as illustrated in FIG. 2A. To do so, epoxy for die attachment is dispensed within a die-attach pad area on the finishing metallic layer 38, followed by die placement and then curing the epoxy to bond the semiconductor die 40 securely.

Figure 2B:
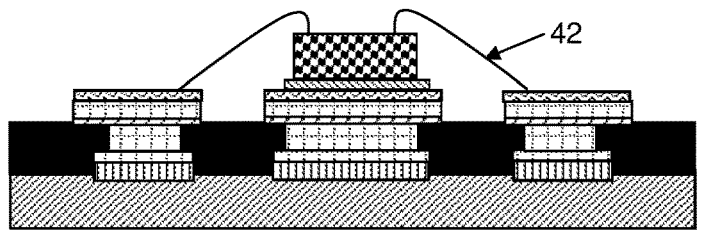

In FIG. 2B, the semiconductor die 40 has been electrically connected to a top finishing layer of the finishing metallic layer 38 by wire-bonding using fine electrical bonding wires 42 as connectors. The bonding wires 42 may typically comprise gold or copper wire. Alternatively, the semiconductor die 40 may be attached by a flip chip bonding process (not illustrated) using the solder-tip bumps formed on a bottom surface of the semiconductor die 40 for attachment and forming electrical connections with the finishing metallic layer 38.

Figure 2C:
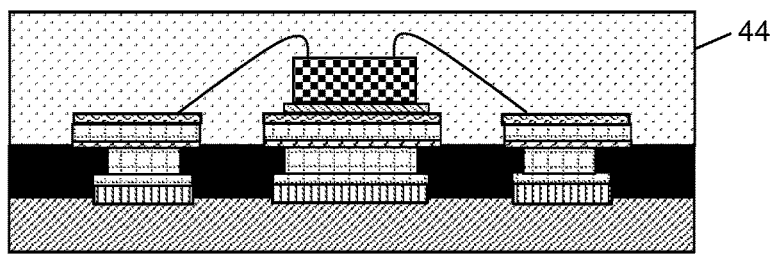
Figure 2D:
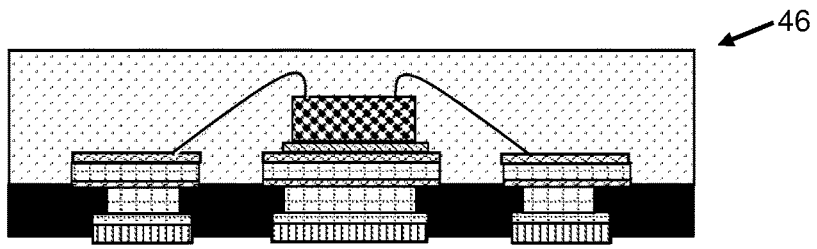

Thereafter, the semiconductor die 40, the bonding wires 42, epoxy, die pads, and wiring traces are encapsulated by a second dielectric layer 44 to protect the same from the external environment, as shown in FIG. 2C. The encapsulant is preferably a molding compound that is introduced by an injection molding, transfer molding or compression molding process.

After the encapsulant is molded to encapsulate the semiconductor die and bonding wires 42 and other connections, the substrate carrier 10 is removed to leave a finished semiconductor package 46. The removal of the substrate carrier 10 should preferably be by mechanical means, such as by peeling. Peeling off the substrate carrier 10 exposes the underlying surface mount layer or input/output pad layer of the semiconductor package 46 comprising the first metallic layer 16, for mounting the semiconductor package 46 to other devices.

Figure 3A:
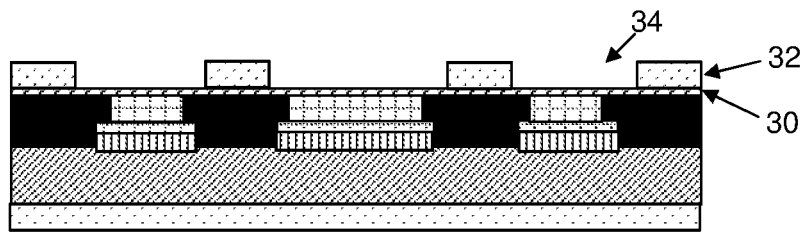
FIGS. 3A to 3G illustrate the incorporation of selective surface finishes onto the trace layer of the fabricated substrate.

FIGS. 3A to 3G illustrate the incorporation of selective surface finishes onto the trace layer of the fabricated substrate. In FIG. 3A, a patterned third photo-resist layer 32 has been formed in accordance with FIG. 1N above. There are exposed portions 34 in the third photo-resist layer 32 that expose corresponding top surfaces of portions of the underlying conductive seed layer 30.

Figure 3B:
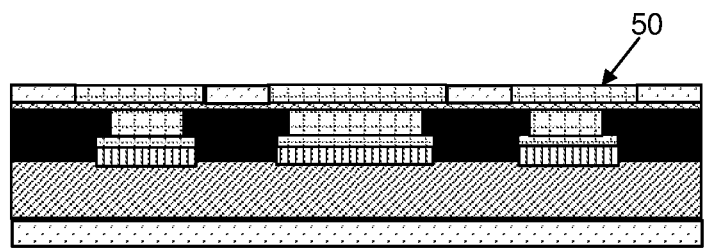

In FIG. 3B, in order to form a trace layer, a third metallic layer 50 is deposited onto the conductive seed layer 30 by an electroplating process using the patterned third photo-resist layer 32 as a mask. Optionally, another copper layer may be deposited onto the third metallic layer 50 inside the exposed portions 34 up to the height of the third photo-resist layer 32.

Figure 3C:
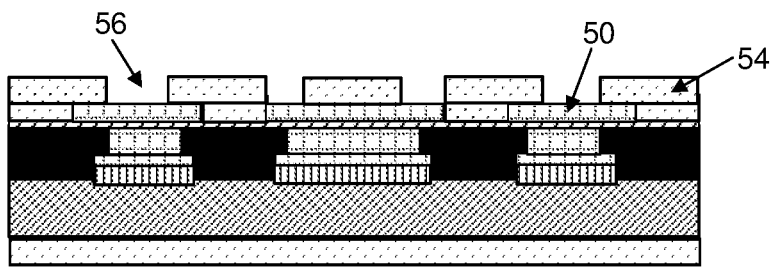

In FIG. 3C, a fourth photo-resist layer 54 has been formed over the third photo-resist layer and the third metallic layer 50 by laminating and covering the same with a photosensitive dry film. The fourth photo-resist layer 32 is further patterned as shown by selective exposure of the fourth photo-resist layer 32 to ultraviolet light and chemically removing portions of the fourth photo-resist layer 54, or by direct laser image processing followed by chemically removing portions of the fourth photo-resist layer 54, in order to create a pre-defined pattern on the fourth photo-resist layer 54. This process creates exposed portions 56 in the fourth photo-resist layer 54 which correspond to certain areas of top surfaces of the third metallic layer 50 to expose some of the underlying third metallic layer 50 for applying selective surface finishing.

Figure 3D:
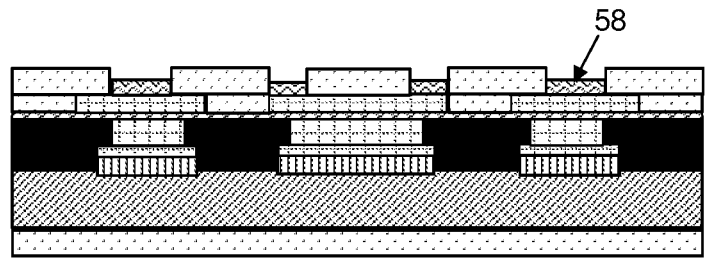

In FIG. 3D, a further finishing metallic layer 58 to form a surface finishing is deposited into the exposed portions 56 by an electroplating process using the fourth photo-resist layer 54 as a mask. Such finishing metallic layer 58 may comprise a nickel-gold layer, a nickel-palladium-gold layer or a silver layer as the surface finishing.

Figure 3E:
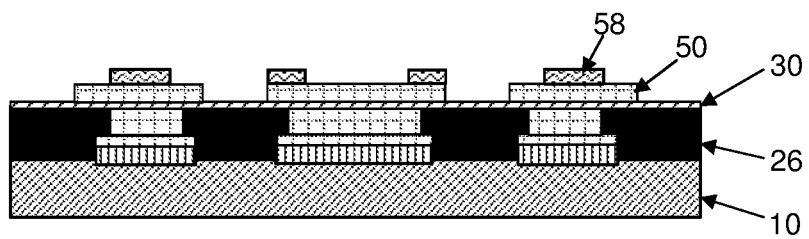
Figure 3F:
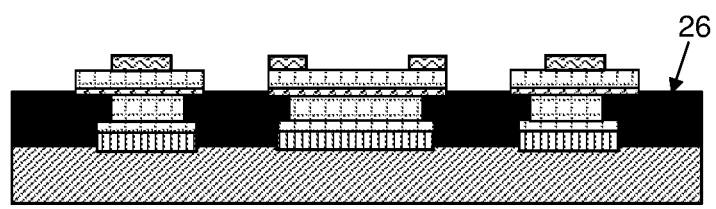

The third photo-resist layer 32 and the fourth photo-resist layer 54 are then removed to form the structure illustrated in FIG. 3E, after which the parts of the conductive seed layer 30 that are exposed are removed to reveal the third metallic layer 50 or finishing metallic layer 58 at locations where they have been formed on the substrate, as illustrated in FIG. 3F. The removal of the conductive seed layer 30 may be conducted by a chemical etching process.

Figure 3G:
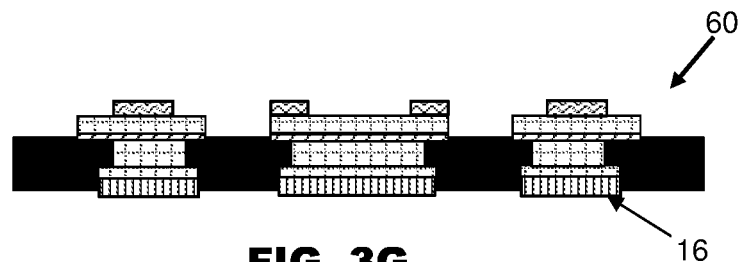

In FIG. 3G, the substrate carrier 10 has been removed to leave an interconnect substrate structure 60 in preparation for a downstream packaging process, including die attachment and encapsulation, such as that described above. The removal of the substrate carrier 10 should preferably be by mechanical means, such as by peeling. Peeling off the substrate carrier 10 exposes the underlying surface mount layer or input/output pad layer of the interconnect substrate structure 60 comprising the first metallic layer 16, for mounting a semiconductor package assembled from the interconnect substrate structure 60 to other devices.

The invention described herein is susceptible to variations, modifications and/or additions other than those specifically described and it is to be understood that the invention includes all such variations, modifications and/or additions which fall within the spirit and scope of the above description.

The invention claimed is:

1. Method of manufacturing a routable electroforming substrate for assembling a semiconductor package, comprising the steps of:
   providing a carrier;
   plating a patterned first metallic layer onto the carrier which is configured to function as a surface mount pad or input/output pad in an assembled semiconductor package;
   plating a patterned second metallic layer comprising copper over the first metallic layer;
   plating a third metallic layer over the second metallic layer which is configured for mounting a plurality of semiconductor dice onto the third metallic layer; and thereafter removing the carrier to expose the first metallic layer;
   wherein the step of removing the carrier is performed prior to mounting the semiconductor dice onto the third metallic layer.

2. The method as claimed in claim 1, wherein the carrier is made of an electrically conductive material which is attractable by magnetic forces.

3. The method as claimed in claim 2, wherein the carrier comprises stainless steel grade 430.

4. The method as claimed in claim 1, further comprising the step of roughening an exposed surface of the carrier by removing a portion of the said exposed surface prior to plating the first metallic layer.

5. The method as claimed in claim 1, wherein the steps of plating the first and second metallic layers are conducted by electroplating.

6. The method as claimed in claim 1, wherein the first metallic layer comprises a gold layer, gold-nickel layers or gold-palladium-nickel layers.

7. The method as claimed in claim 6, further comprising the step of plating a copper layer over the gold layer, gold-nickel layers or gold-palladium-nickel layers, prior to plating the second metallic layer.

8. The method as claimed in claim 1, wherein the second metallic layer has a smaller surface area than that of the first metallic layer, and serves as via interconnects to the first metallic layer.

9. Method of manufacturing a routable electroforming substrate for assembling a semiconductor package, comprising the steps of:
   providing a carrier;
   plating a patterned first metallic layer onto the carrier which is configured to function as a surface mount pad or input/output pad in an assembled semiconductor package;
   plating a patterned second metallic layer comprising copper over the first metallic layer;
   encapsulating the first and second metallic layers in a dielectric material, prior to plating a third metallic layer;
   plating the third metallic layer over the second metallic layer which is configured for mounting a plurality of semiconductor dice onto the third metallic layer; and thereafter
   removing the carrier to expose the first metallic layer.

10. The method as claimed in claim 9, further comprising the step of planarizing the dielectric material and second metallic layer and forming a conductive seed layer onto a top surface thereof, such that the third metallic layer is plated on the conductive seed layer.

11. The method as claimed in claim 1, further comprising the step of bonding a plurality of semiconductor dice onto the third metallic layer, prior to removing the carrier to expose the first metallic layer.

12. The method as claimed in claim 11, further comprising the step of connecting wire bonds between the plurality of semiconductor dice and the substrate prior to removing the carrier.

13. The method as claimed in claim 11, further comprising the step of encapsulating the semiconductor dice with a dielectric layer after bonding the plurality of semiconductor dice.

14. The method as claimed in claim 1, further comprising the step of plating on selected portions of the third metallic layer a surface finishing comprising a nickel-gold layer, a nickel-palladium-gold layer or a silver layer.

15. The method as claimed in claim 1, wherein the carrier is removed by peeling the carrier away from the first metallic layer.

* * * * *